United States Patent
Kalajo et al.

(10) Patent No.: US 7,512,386 B2
(45) Date of Patent: Mar. 31, 2009

(54) METHOD AND APPARATUS PROVIDING INTEGRATED LOAD MATCHING USING ADAPTIVE POWER AMPLIFIER COMPENSATION

(75) Inventors: Sami Kalajo, Helsinki (FI); Esko Jarvinen, Espoo (FI); Ville Vintola, Espoo (FI); Frank Anthony Tamborino, Summerfield, NC (US); William Sheridan Kopp, Greensboro, NC (US)

(73) Assignees: Nokia Corporation, Espoo (FI); RF Micro Devices, Inc., Greensboro, NC (US)

( * ) Notice: Subject to any disclaimer, the term of this patent is extended or adjusted under 35 U.S.C. 154(b) by 456 days.

(21) Appl. No.: 10/651,910

(22) Filed: Aug. 29, 2003

(65) Prior Publication Data

US 2005/0059362 A1    Mar. 17, 2005

(51) Int. Cl.
*H04B 1/04* (2006.01)
*H04B 17/00* (2006.01)
*H03C 1/62* (2006.01)
*H01Q 11/12* (2006.01)

(52) U.S. Cl. .................... 455/127.1; 455/117
(58) Field of Classification Search ............... 455/126, 455/127.1, 69, 234.2, 234.1, 115; 324/648; 330/296, 129, 207, 298, 279, 133
See application file for complete search history.

(56) References Cited

U.S. PATENT DOCUMENTS

| | | | |
|---|---|---|---|
| 4,041,410 A | 8/1977 | Belcher | 330/129 |
| 4,122,400 A | 10/1978 | Medendorp et al. | 330/207 P |
| 4,673,886 A | 6/1987 | Bickley et al. | 330/298 |
| 4,709,403 A | 11/1987 | Kikuchi | 455/126 |
| 4,727,337 A | 2/1988 | Jason | 330/298 |
| 4,859,967 A | 8/1989 | Swanson | 330/298 |
| 4,982,435 A * | 1/1991 | Kato et al. | 381/102 |
| 5,003,271 A | 3/1991 | Swanson | 330/298 |
| 5,070,309 A | 12/1991 | Swanson | 330/298 |
| 5,150,075 A | 9/1992 | Hietala et al. | 330/279 |
| 5,278,994 A | 1/1994 | Black et al. | 455/126 |
| 5,291,150 A | 3/1994 | Saarnimo et al. | 330/279 |

(Continued)

FOREIGN PATENT DOCUMENTS

WO    WO 02/15397 A2    2/2002

*Primary Examiner*—Naghmeh Mehrpour
(74) *Attorney, Agent, or Firm*—Harrington & Smith, PC

(57) ABSTRACT

An RF power amplifier module can be used without a matching device between the power amplifier module and an antenna. The power amplifier module is constructed and operated to detect, protect and maintain the performance of the power amplifier in the presence of severe VSWR load mismatches, without requiring the use of external circuitry. The RF power amplifier module includes integral detection circuitry for generating a first detection signal having a value that is indicative of the current flowing through an output power transistor and a second detection signal having a value that is indicative the voltage appearing at the output of the output power transistor, as well as integral compensation circuitry for controlling the generation of a plurality of bias current and bias voltage signals to have values that are a function of the values of the first and second detection signals, as well as the current output power level of the RF power amplifier module. Also included is an integral impedance matching circuit, coupled between the output of the output transistor and the output node, that provides a variable impedance that is selectively controlled by an output signal from the compensation circuitry.

25 Claims, 7 Drawing Sheets

U.S. PATENT DOCUMENTS

| | | | |
|---|---|---|---|
| 5,404,114 A | 4/1995 | Sager | 330/207 P |
| 5,404,585 A | 4/1995 | Vimpari et al. | 455/115 |
| 5,432,473 A | 7/1995 | Mattila et al. | 330/133 |
| 5,448,770 A | 9/1995 | Hietala et al. | 455/126 |
| 5,564,086 A | 10/1996 | Cygan et al. | 455/126 |
| 5,590,408 A * | 12/1996 | Weiland et al. | 455/69 |
| 5,659,253 A * | 8/1997 | Busking | 324/648 |
| 5,724,003 A | 3/1998 | Jensen et al. | 330/129 |
| 5,862,458 A * | 1/1999 | Ishii | 455/107 |
| 5,873,029 A | 2/1999 | Grondahl et al. | 455/126 |
| 5,880,635 A | 3/1999 | Satoh | 330/144 |
| 5,898,912 A * | 4/1999 | Heck et al. | 455/234.2 |
| 6,002,922 A | 12/1999 | Schwent | 455/115 |
| 6,008,698 A | 12/1999 | Dacus et al. | 330/279 |
| 6,188,277 B1 | 2/2001 | Borodulin et al. | 330/51 |
| 6,265,939 B1 | 7/2001 | Wan et al. | 330/140 |
| 6,289,205 B1 | 9/2001 | Pollanen et al. | 455/126 |
| 6,566,944 B1 | 5/2003 | Pehlke et al. | 330/10 |
| 6,753,734 B2 * | 6/2004 | Arell et al. | 330/296 |
| 2005/0032488 A1* | 2/2005 | Pehlke et al. | 455/127.1 |

* cited by examiner

METHOD AND APPARATUS PROVIDING INTEGRATED LOAD MATCHING USING ADAPTIVE POWER AMPLIFIER COMPENSATION

TECHNICAL FIELD

This invention relates generally to radio frequency (RF) amplifiers and, more specifically, relates to RF power amplifier integrated circuits and modules suitable for use in mobile communications and other types of devices.

BACKGROUND

In wireless communication devices that use an RF power amplifier (PA) it is known that a severe Voltage Standing Wave Ratio (VSWR) load variation can temporarily or permanently degrade the performance of the power amplifier. To avoid this problem it is well-known in the art to provide an isolator between the output of the PA and an antenna that is fed by the PA. However, this approach requires the use of a separate element (the isolator), which can be large in size and which furthermore adds cost and complexity to the RF transmitter circuitry of which the PA forms a part.

In general, the operation of an RF PA is based on a tuned load line. The load line is defined by the bias voltage, bias current and load impedance. Correctly set, the load line optimizes the voltage and current waveforms of the PA output power transistor, as well as the desired output power where the optimum PA efficiency is achieved. An output-matching network is used to transform the output impedance, typically 50 ohms, to the optimum load impedance for the output transistor. The output-matching network is designed to provide the desired impedance transformation ratio with the desired output frequency.

In a typical radio transmitter the PA output is followed by a filter and/or a switch, and then by the antenna. The antenna is typically designed to have a 50 ohm input impedance when radiating into free space, and the filter and/or switch between the antenna and the PA is designed to have 50 ohm input and output impedances. Thus, in order to provide impedance matching the output impedance of the PA must also be 50 ohms. However, in portable, handheld communications devices the antenna impedance may vary from the ideal 50 ohm value due to the variability of the environment that the antenna radiates into. This change in the antenna impedance is seen as a mismatch by the output of the PA, and can result in a degradation in the RF transmitter performance.

A variation in the load impedance (i.e., the load mismatch) can present a serious problem in many systems, such as a wideband code division, multiple access (WCDMA) wireless communications system, since the WCDMA system requires that the PA exhibit good linearity. In the WCDMA system, a PA load mismatch can result in signal distortion and a degradation in performance. The end result is that under a load mismatch condition the stringent WCDMA transmitter requirements can become more difficult or even impossible to meet.

As was noted above, it is known in the art to use a matching device, such as an isolator or a circulator, to isolate the output of the PA from the antenna. By so doing the PA always sees a nominal 50-ohm impedance, despite the variation in antenna impedance, and signal distortion is avoided. A drawback of this approach is the additional loss that results in the matching device. Adding the matching device in the transmitter path also increases the component count, the cost, the power consumption and the required circuit board area. All of these factors are considered to be disadvantageous in handheld, battery powered, mass produced communications equipment, such as cellular telephones.

It is also known in the art to use a reflectometer and associated circuitry to protect the PA from severe load mismatches. The reflectometer is realized by a dual directional coupler having a length of $\lambda/4$ and associated circuitry. This technique uses the forward and reflected voltages to detect the VSWR mismatch, and associated circuitry is then used to compensate the power amplifier or surrounding circuitry to adapt to the VSWR mismatch. As with the use of the matching device, this technique increases the losses, cost and circuit board area of the transmitter.

It is also possible to detect the impedance mismatch condition, and then adapt an impedance matching network, or the PA, to compensate for the detected load mismatch condition. The adaptation can be made by adjusting the drive to the PA, adjusting the PA biasing, or to use a diode to transform the impedance to a more suitable form.

U.S. Pat. No. 5,564,086 describes one such conventional technique to protect a PA. Referring to FIG. 1, the output of the PA 1 is connected to a variable matching network 2, which in turn is connected to an antenna 4 via a directional coupler 3. The directional coupler detects a mismatch condition in combination with a diode detector, and provides output signals to a processor 5 that adjusts the variable matching network 2 accordingly. The directional coupler 3 can be used to sample the reflected signal 6A independently of the forward signal 6B, and the magnitude of the impedance presented by the antenna 4 can thus be determined. As can be appreciated, this approach involves adding circuitry and complexity to the RF transmitter, and thus suffers from disadvantages discussed above.

It is also known to use a current detector to sense PA power, such as is shown in U.S. Pat. Nos. 5,404,585, 5,448,770 and 4,859,967. It is also known to employ voltage detectors in conjunction with a PA, as described in U.S. Pat. Nos. 6,265,939, 6,002,922, 5,873,029, 5,659,253 and 4,041,410. It is further known to use an RF detector to control the PA, as described in U.S. Pat. Nos. 5,724,003, 5,432,473, 5,291,150, 5,278,994, 5,150,075, 4,709,403, 4,673,886 and 5,564,086.

It is further known that PA systems can have power detection and control, as shown in U.S. Pat. Nos. 6,188,277, 5,404,114, 5,003,271, 4,859,967, 4,727,337 and 4,122,400.

Further in this regard reference can also be made to U.S. Pat. No. 5,070,309, where an RF power amplifier has an On and an Off condition. When On, the PA normally receives and amplifies an input RF signal to provide an amplified output RF signal. Both RF current and RF voltage in an output circuit are detected. A first signal is provided from the RF current and exhibits a fixed amplitude, but a frequency and phase corresponding with that of the RF current. A second signal of fixed amplitude is provided that corresponds in frequency and phase with the RF voltage. The first and second signals are compared to provide a phase signal having a magnitude dependent upon the phase difference between the first and second signals. The phase signal is then compared with a reference and, based on the result of the comparison, the RF PA can be placed into the Off condition.

U.S. Pat. No. 6,289,205 B1 describes a high frequency power amplifier that includes an output stage for outputting an amplified high frequency signal, and measuring devices for measuring the power of the high frequency signal.

The foregoing U.S. patents do not fully address the PA problems that can result from VSWR load mismatches.

SUMMARY OF THE PREFERRED EMBODIMENTS

The foregoing and other problems are overcome, and other advantages are realized, in accordance with the presently preferred embodiments of these teachings.

This invention provides a power amplifier which can be used without a matching device, such as an isolator or a circulator, between the power amplifier and the load, such as a load that includes an antenna. The teachings of this invention can be applied to any application, including RF communications applications and non-RF communications applications, where power amplifier performance is affected by load impedance variations.

A power amplifier that is constructed and operated in accordance with this invention detects, protects and maintains the performance of the power amplifier in the presence of severe VSWR load mismatches.

In accordance with an aspect of this invention an RF power amplifier module includes integral detection circuitry for generating a first detection signal having a value that is indicative of the current flowing through an output power transistor, and also generates a second detection signal having a value that is indicative the voltage appearing at the output of the output power transistor. The RF power amplifier module further includes integral compensation circuitry for controlling the generation of a plurality of bias current and bias voltage signals to have values that are a function of the values of the first and second detection signals, and the current output power level of the RF power amplifier module The RF power amplifier module further includes an integral impedance matching circuit that is coupled between the output of the output transistor and the output node. The impedance matching circuit presents a variable impedance that is selectively controlled by an output signal from the compensation circuitry.

The invention also pertains to a method to operate a power amplifier module over a range of output power levels, The method includes generating a first detection signal having a value that is indicative of current flowing through an output transistor and a second detection signal having a value that is indicative of a voltage appearing at an output of the output transistor; and automatically compensating a load line of the output transistor for impedance variations appearing at an output node of the power amplifier module by controlling the generation of a plurality of power amplifier bias current and bias voltage signals to have values that are a function of the values of the first and second detection signals, and the current output power level of the power amplifier module. The method further includes controlling, with an output signal from the compensation circuitry, a value of an impedance matching circuit coupled between the output of the power transistor and the output node.

A further aspect of this invention pertains to a mobile radiotelephone terminal that includes an antenna and a power amplifier that is constructed and operated in accordance with the invention.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 2:
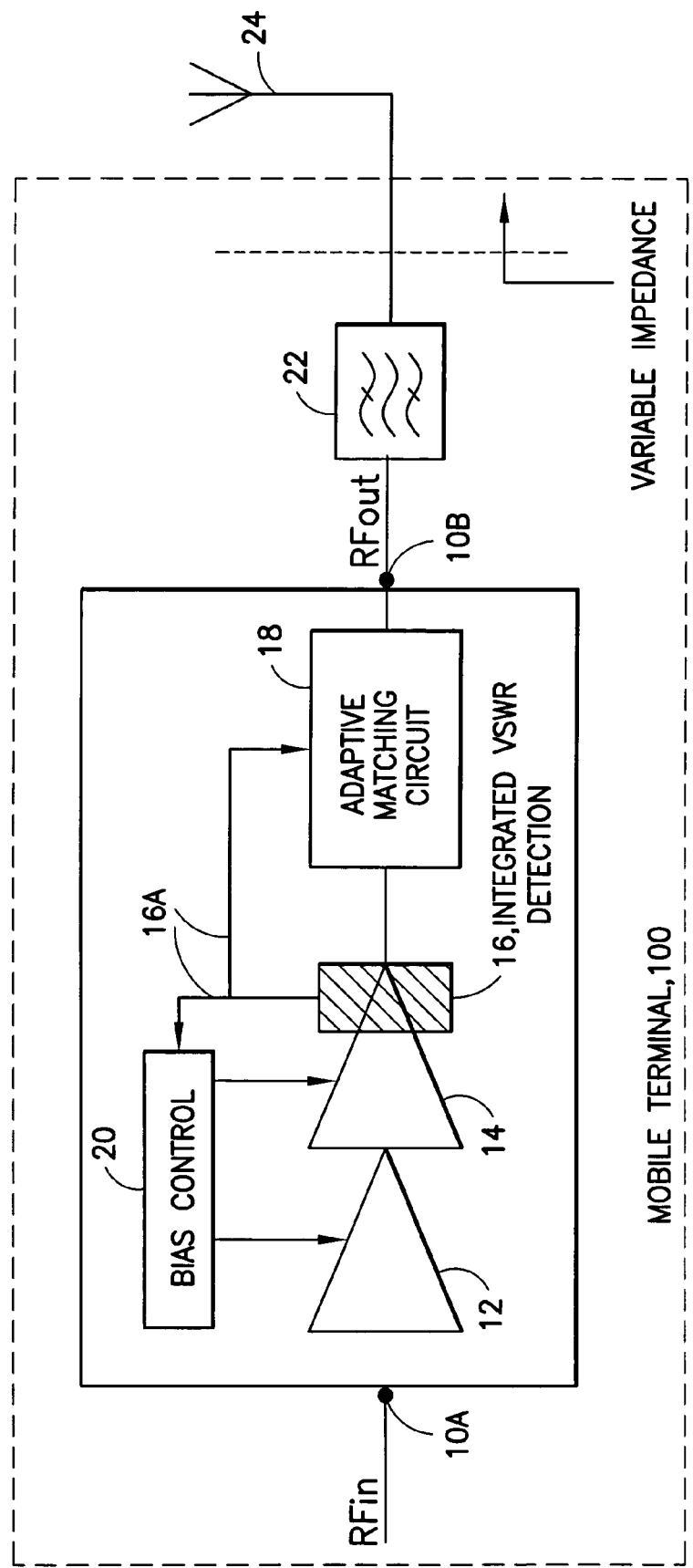
FIG. 2 is a simplified block diagram of a PA having integrated load matching by adaptive PA compensation, in accordance with this invention.

Referring to FIG. 2, a PA 10 in accordance with this invention includes an input node 10A for coupling an input RF signal ($RF_{IN}$) to a first amplifier stage 12. The PA 10 further includes a second, final amplifier stage 14, and an integrated VSWR detection block 16, also referred to below as a mismatch detection circuit and as a detection and compensation circuit, that is coupled to the output of the second amplifier stage 14. The PA 10 also includes an integrated adaptive matching circuit 18 and a bias control circuit 20, each controlled by a signal or signals 16A output from the integrated VSWR detection block 16. The bias current generator 20, as will be described below in relation to FIG. 4, includes first and second amplifier stage bias current generators 20A and 20B, as well as a first and a second amplifier stage bias voltage generator 20C. The PA 10 has an output node 10B for coupling an amplified RF signal ($RF_{OUT}$) to an antenna 24 via, typically, one half of a duplexer filter 22. The antenna 24 is assumed to represent a variable impedance to the output node 10B, which can result in the undesirable generation of VSWR.

In a presently preferred, but non-limiting, embodiment of this invention the PA 10 is installed within and forms a part of a battery powered, mobile radiocommunication terminal 100, such as a cellular telephone that operates so as to be compatible with a code division, multiple access (CDMA) air interface, and more preferably with a wideband CDMA (WCDMA) air interface.

In this invention VSWR load mismatch detection and adaptive PA compensation is performed internally to the PA 10. An advantage of this technique is that it does not require any additional components external to the PA 10, thereby eliminating the need for an isolator, or a circulator, or a reflectometer and/or a coupler and thereby conserves circuit board space. Losses in the transmission path between the PA 10 output node 10B and the antenna feed are also reduced.

In the preferred embodiment the PA 10 is constructed so as to include built-in, integrated circuitry for performing VSWR mismatch detection for controlling PA biasing 20 and the output matching circuit 18 according to detected signals. By using this technique the PA 10 adapts to a varying load impedance, thereby maintaining output linearity under all operating conditions. This invention can also be employed to improve the efficiency of the PA 10 at low power levels, by detecting the power level and tuning the bias control 20 and/or the output matching circuit 18 accordingly.

The output impedance seen by the PA 10 is either complex or real, and has a varying magnitude and/or phase. This complex impedance causes the voltages and currents to change independently with phase. As will be described below in relation to FIGS. 5A and 5B, the relationship of these signals is used, in conjunction with a load switch, to vary the performance of the PA 10, that is, to vary the PA 10 gain, power, linearity and efficiency as a function of the complex load impedance presented by the antenna 24.

The integrated VSWR detection block 16 of this invention detects AC current and AC voltage of the PA 10, with respect to the phase and magnitude of the load and power level. Employing these measured/detected values the following parameters are obtained: VSWR detection as a function of power and phase; power detection as a function of power and phase; AC current as a function of power and phase; load line adjustment as a function of power and phase; and PA 10 protection as a function of power and phase.

Based on the detected signals, the load line is adjusted and the PA 10 performance is maintained up to, for example, a 9:1 VSWR ratio with all phases. Depending on the output VSWR, power level compensation can be performed using the PA 10 bias voltages/currents, by bias control block 20, and/or using the output matching circuit 18. In the presently preferred embodiment the detection and compensation functions are all internal to the PA 10, i.e., between the input node 10A and the output node 10B of the PA 10 package.

Figure 3:
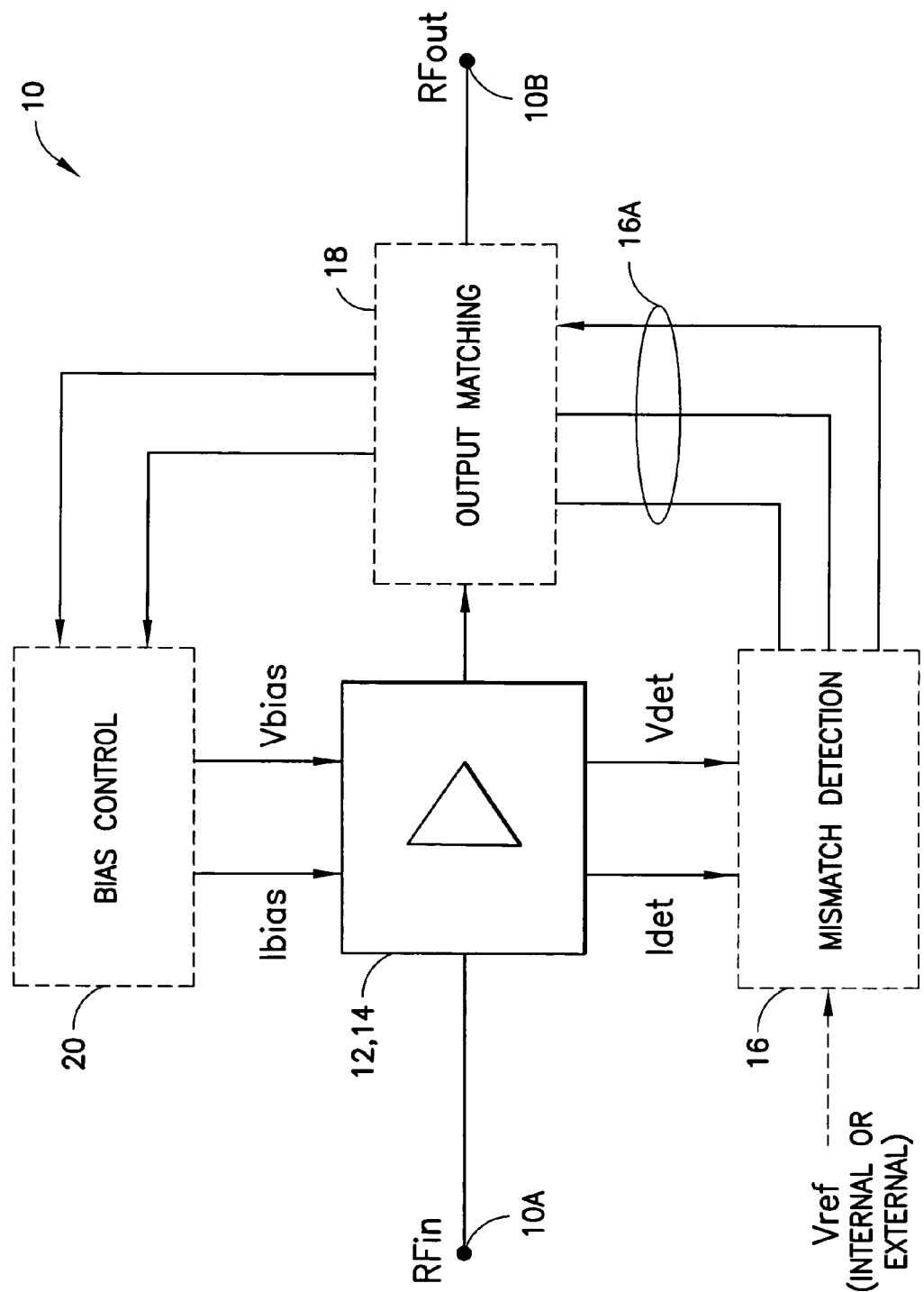
FIG. 3 is a more detailed block diagram of the PA of FIG. 2.

FIG. 3 shows another view of the PA 10, and input and output signals of the first and second amplifiers 12 and 14 and the power detection circuitry. The bias control 20 outputs bias signals Ibias (bias current) and Vbias (bias voltage). In the presently preferred, but not limiting embodiment, the PA 10 includes two power detectors that are integrated onto a GaAs Heterojunction Bipolar Transistor (HBT) die with the other components of the PA 10.

Figure 4:
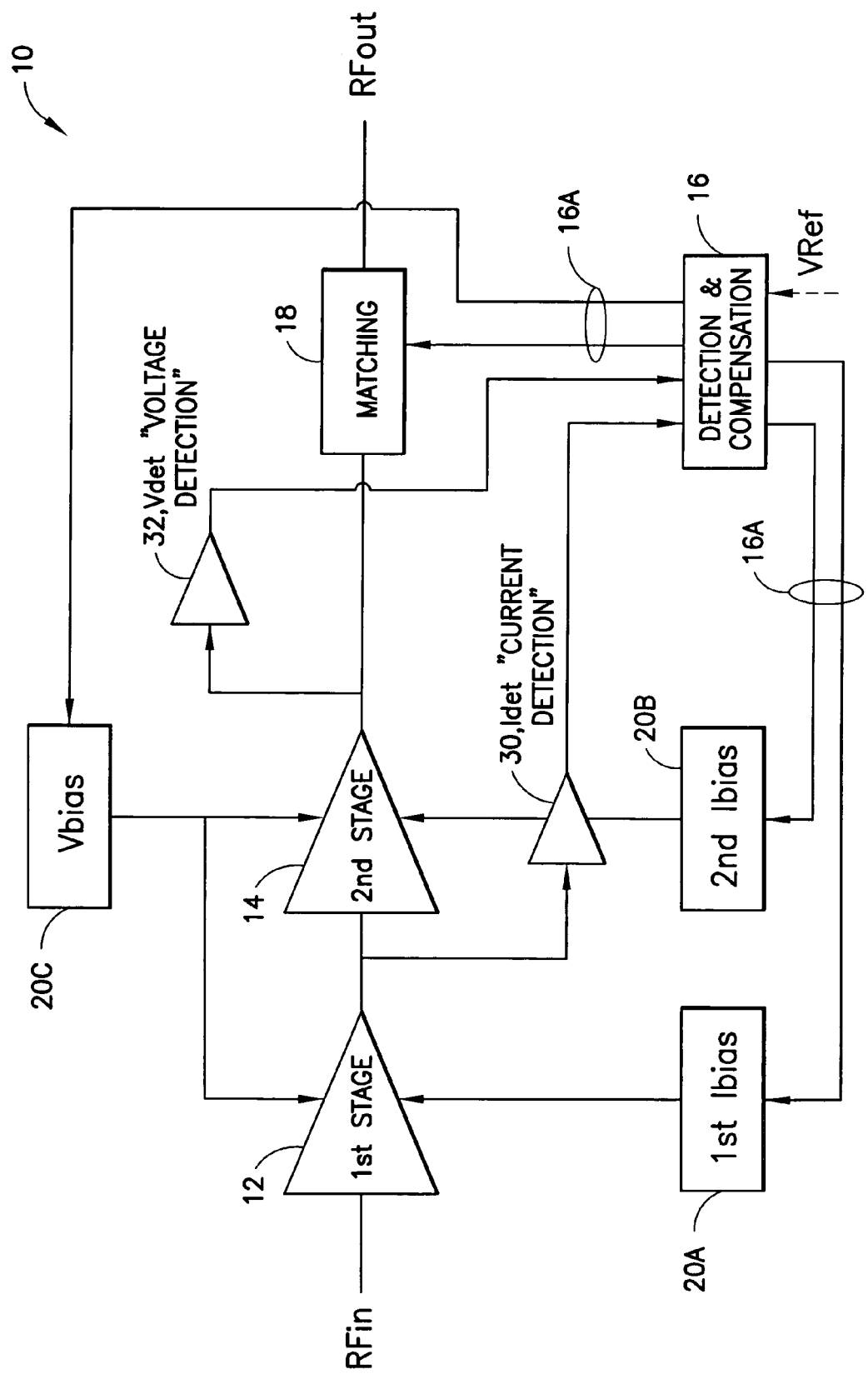
FIG. 4 is a still more detailed block diagram of the PA of FIGS. 2 and 3.
Figure 5A:
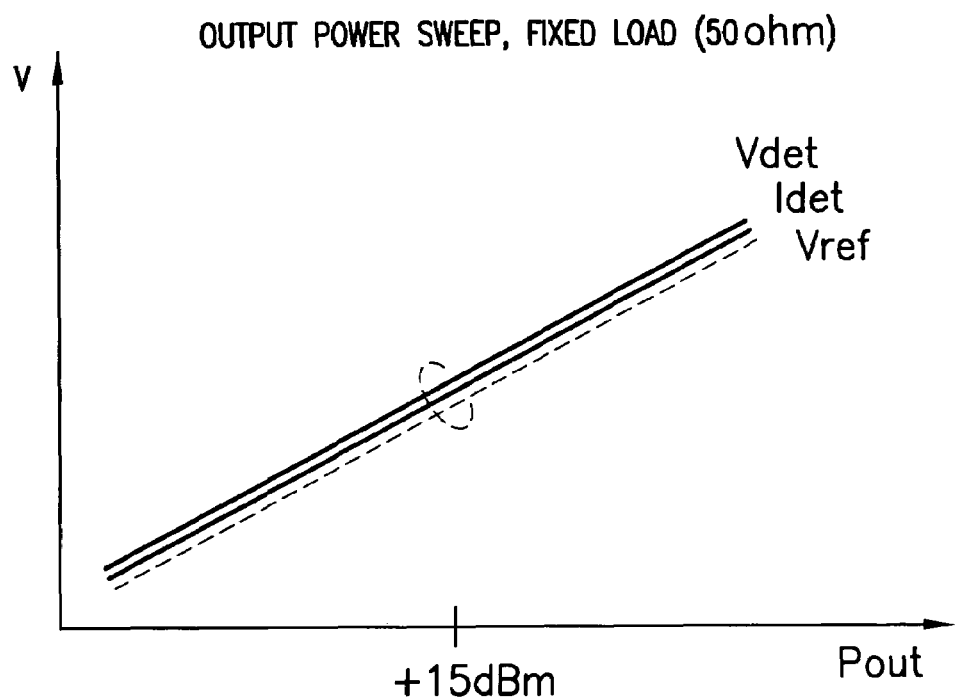
FIGS. 5A and 5B are graphs plotting voltage versus output power and load impedance, respectively, and show, in FIG. 5A, that two power detectors have similar responses when a nominal 50 ohm load impedance is present, but have different responses when the load impedance varies from the nominal 50 ohm value (FIG. 5B)
Figure 5B:
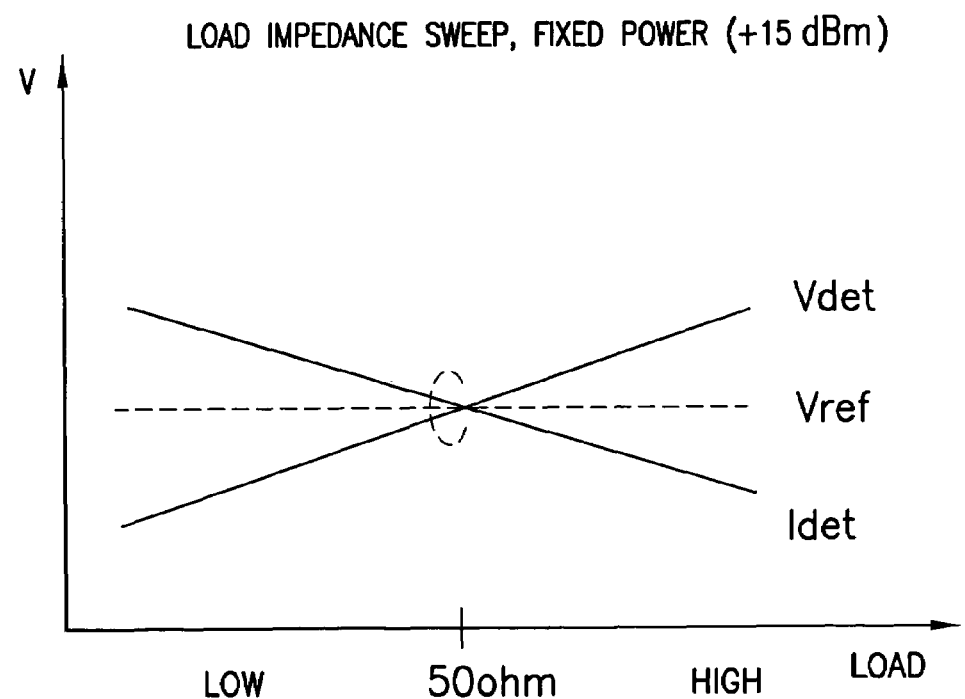

Referring also to FIG. 4, the first power detector, referred to as IDET 30, is a power detector based on AC detection at the input to the second stage 14, while the second power detector, referred to as VDET 32, is based on voltage detection at the output of the second stage 14. As can be seen in FIG. 5A, these two power detectors have similar responses when a nominal 50 ohm load impedance is present at the output node 10B, but have different responses when the load impedance varies from the nominal 50 ohm value, as is shown in FIG. 5B. This feature enables the VSWR detector, also referred to as the mismatch detector 16, to detect the presence of a load mismatch, and to determine an amount of compensation to be applied to the PA 10. Vref is a reference voltage, shown in FIGS. 3, 4, 5A, 5B and 6, that is applied to the mismatch detector 16, and that is used to establish a reference or threshold for comparisons made by the mismatch detector 16, as will be described in further detail below in reference to FIG. 6. The Vref voltage can be generated internally within the PA 10 module, or it can be an external reference signal. The mismatch detector 16, referred to in FIG. 4 as the detection and compensation block 16, receives inputs from the IDET 30 and VDET 32, as well as the Vref signal, and outputs control signals to the first stage 12 and second stage 14 bias current generators 20A and 20B, respectively, as well as a control signal to the first and second stage 14 bias voltage generator 20C. The detection and compensation block 16 also outputs a signal to the output matching block 18.

The operation of the detection and compensation block 16 of FIG. 4 is now described in further detail for the cases of PA output device current and voltage detection and PA 10 compensation.

Figure 7:
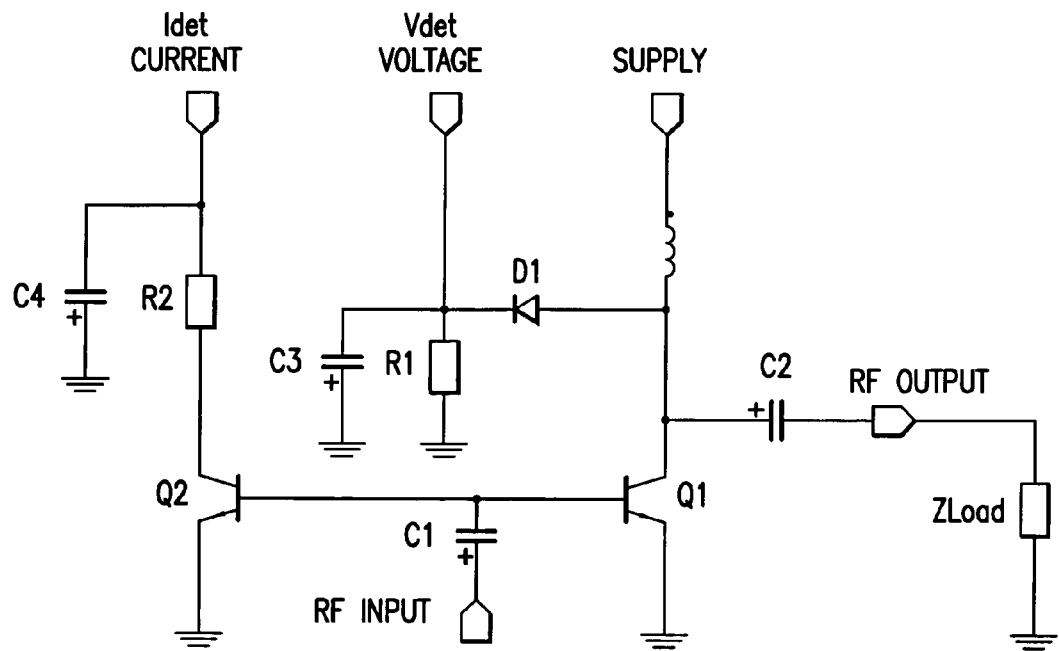
FIG. 7 is a simplified schematic diagram that illustrates an embodiment of the IDET and VDET functions shown in FIG. 4.

Detection:

The IDET detector 30 monitors the current of the PA output device (i.e., the output power transistor that is shown in FIG. 7 as Q1, described below). The VDET detector 32 is peak voltage detector connected to the collector/drain of the output device. These two detectors are both used for power detection. When the PA 10 is matched (50 ohm output impedance), the responses of these two detectors are calibrated to be equal (as shown in FIG. 5A). In addition, the power detector 30, 32 outputs are matched to the internal (or external) reference voltage Vref. The value of Vref is proportional to the desired output power from the PA. That is, during normal operation the value of Vref varies up and down, depending on the PA output power.

In the matched condition (50 ohm load impedance), all voltages (shown in FIG. 6 as IDET, VDET, VREF) are equal. When the PA 10 output impedance changes, the value of VREF remains constant, but the values of IDET and VDET vary because they are affected by PA 10 load impedance changes.

In accordance with an aspect of this invention, the collector/drain impedance seen by the PA 10 can be determined by comparing these three signals, and the PA 10 can thus be tuned or compensated accordingly.

Compensation:

The presently preferred embodiment of the PA 10 includes an integrated DC/DC converter, shown as the first and second stage Vbias generator 20C in FIG. 4, for use in the first and second stage transistor collector/drain voltage tuning. In addition, the bias currents of the first and second stage transistor devices can be tuned through the integrated bias current generators 20A and 20B, respectively. The output matching circuit 18, shown in further detail in FIG. 8, is preferably tuned by connecting an additional shunt element (resistor R1 via switch S1) to the matching circuit 18 in the case of a severe impedance mismatch when operating at high power.

Figure 8:
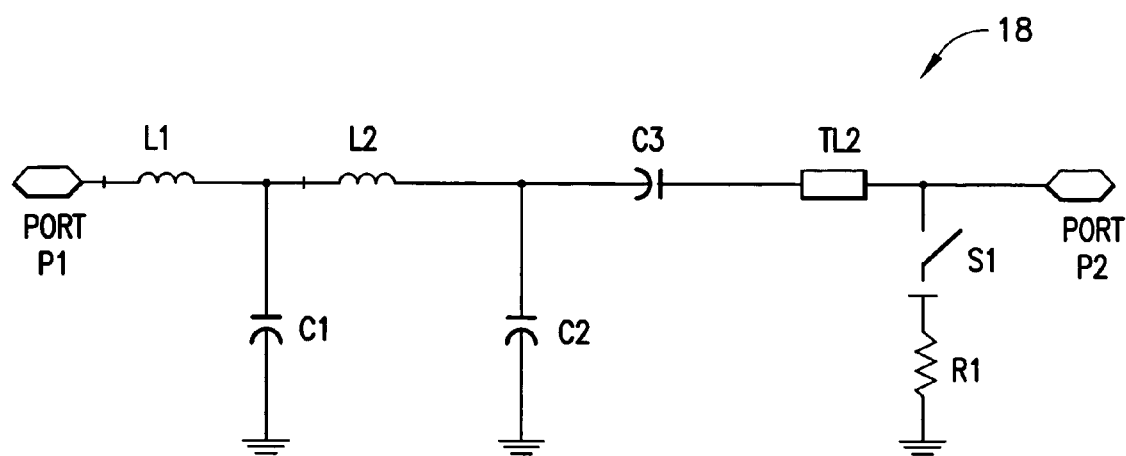
FIG. 8 is a simplified schematic of the output matching circuit.

The output matching circuit 18 in FIG. 8 includes, as a non-limiting embodiment, matching inductors L1 and L2, matching capacitors C1 and C2, a DC blocking capacitor C3, transmission line TL2, the switch S1 and the resistor R1. By selecting the values of L1, L2, C1, C2, C3 and TL2 the desired impedance transformation between ports P1 and P2 is achieved.

Figure 6:
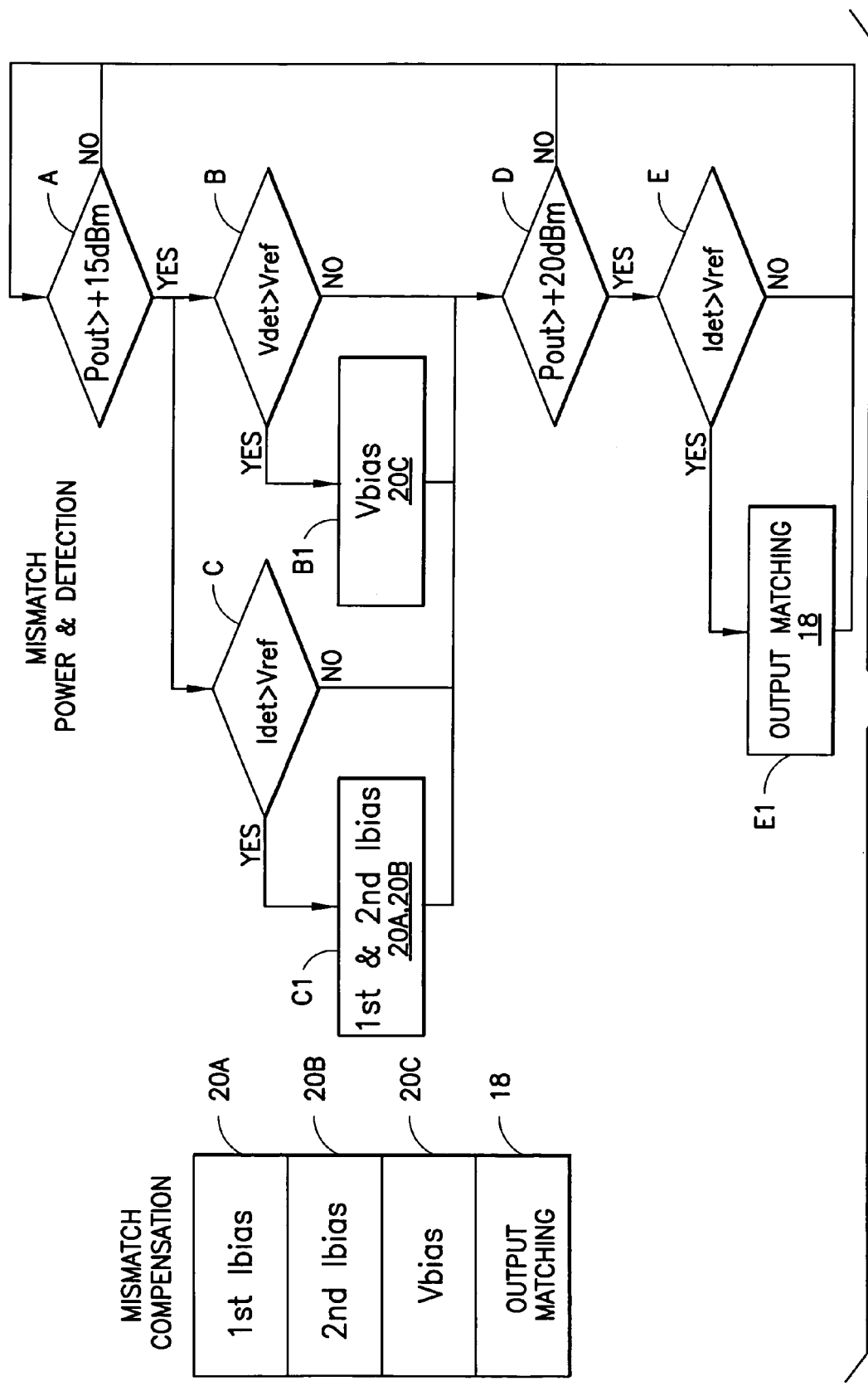
FIG. 6 illustrates the operation of the impedance detection and PA compensation block of FIG. 4.

All compensation is preferably accomplished internally to the PA 10 package or module. The amount of the compensation is dependent on the power level (indicated by the value of Vref) and the output VSWR that is present. The compensation in the presently preferred, but non-limiting embodiment, is accomplished as follows. Reference is also made to FIG. 6.

In the presently preferred, but non-limiting embodiment, the PA 10 is tuned to meet, in the matched condition (50 ohm output impedance), a WCDMA linearity specification of −35 dBc adjacent channel power (ACP), and −45 dBc alternate channel power (ALT) at +24 dBm output power. With power levels less than +15 dBm, the PA 10 is capable of meeting these linearity requirements up to 9:1 output VSWR, and thus no compensation is needed (Block A).

When the output power (Pout) is greater than +15 dBm (as indicated by the value of VREF), VDET and IDET are each compared to VREF. If VDET is greater than VREF (Block B), the PA 10 output device collector/drain impedance (Q1 in the example of FIG. 7 described below) is indicated as being greater than the nominal 50 ohm case, and the collector/drain bias voltage (Vbias) is increased to avoid RF voltage clipping (Block B1). If IDET>VREF (Block C), then the PA 10 output device collector/drain current is indicated as being greater than the nominal 50 ohm case. This condition is indicative of the collector/drain impedance being too low, and this is compensated by increasing the bias current of the $2^{nd}$ stage and/or the 1st stage (Ibias), as shown at Block C1.

When the power level exceeds +20 dBm (Block D), the above described compensation has been found to be insufficient to achieve the require linearity. In the case where Pout>+20 dBm (Block D) and IDET>VREF (Block E), the output matching network 18 is adjusted (Block E1). This can be accomplished by connecting the shunt resistor R1 to the output matching circuit 18, as was described above with regard to FIG. 8. While this reduces the output power of the PA 10, it beneficially aids in achieving the correct voltage and current waveforms at the collector/drain of the output device, and thus maintains the desired linearity.

The compensation loop represented by Blocks A-E can be executed as often as is desired or required by a given application, enabling substantially real-time compensation of the PA 10 load line in response to changing VSWR conditions.

As should be recognized by those skilled in the art, the functionality represented by FIG. 6 can be implemented through the use of, as one example, a simple state machine and a plurality of voltage comparators for comparing IDET to VREF, VDET to VREF and VREF to two predetermined threshold voltages, one representing +15 dBm and the other representing +20 dBm, in addition to a plurality of up/down counters controlled by the comparator outputs, and a plurality of DACs that convert the counter outputs to corresponding analog values for generating the signals to the bias current generators 20A, 20B and the bias voltage generator 20C. A single digital bit can be used to control the state of the switch S1 that selectively places the shunt resistor R1 into the impedance matching resistor network 18.

In case of a reactive mismatch, i.e., the load impedance having a negative (capacitive) or a positive (inductive) imaginary part, the compensation can be achieved using the same principles as those described above. That is, when the phase angle of the output impedance is such that collector/drain voltage of the output device is too large (VDET>VREF), the bias voltage (Vbias) compensation can be used. When the phase angle is such that output device current is too large (IDET>VREF), the bias current compensation (Ibias) can be used or, at higher power levels (e.g., Pout>+20 dBm), the output matching network 18 can be tuned.

FIG. 7 is a simplified schematic diagram of a circuit that can be used to implement the IDET 30 and the VDET 32 of FIG. 4. In FIG. 7 the output power transistor Q1 is shown as a bipolar transistor, although in other embodiments of this invention it may be a power FET (hence the references above to the output device drain, as opposed to collector). The RF input from the first stage 12 is capacitively coupled by C1 to the base of Q1, as well as to the base of current mirror transistor Q2. The current through Q1 is thus mirrored by Q2 and is low pass filtered by R2 and C4. This provides a reference current that is proportional to the current through the output transistor Q1, and forms the output of IDET 30. The IDET output current may be converted to a voltage if desired.

For realizing VDET 32, the AC voltage at the collector of Q1 is rectified by D1 and then low pass filtered by R1 and C3. The low pass filtered voltage, having a value that is proportional to the collector voltage of Q1, forms the output of VDET 32.

While in the presently preferred embodiment the IDET (Q1 collector current $I_c$) and VDET (Q1 collector voltage $V_c$) values are used separately (see FIG. 6), it should be appreciated that these values can also be used to directly determine the impedance, since the impedance can be calculated by dividing VDET by IDET (i.e., $V_c/I_c$), and by ignoring the sign of the quotient. For too low an impedance value, Q1 can draw excessive current and can break down. If the impedance value is too high, the amplifier will saturate too soon, and distortion of the output signal will result.

Figure 1:
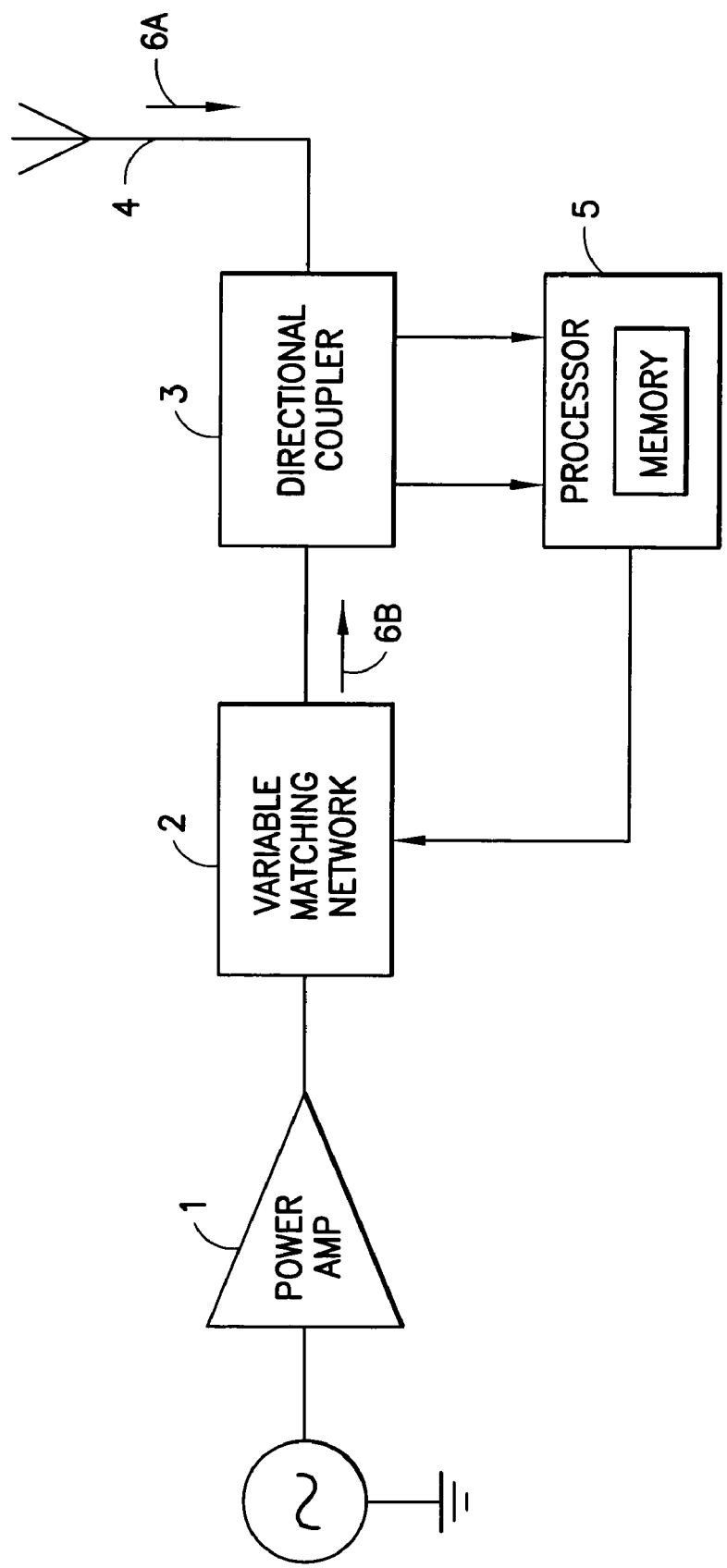
FIG. 1 shows an example of a prior art PA with a directional coupler and output matching circuit control.

As should be appreciated, this invention provides a number of advantages relative to the prior art. For example, the use of this invention can eliminate the need for external (to the PA 10) additional components such as an isolator, circulator and/or a coupler, and thus overcomes the deficiencies in the prior art circuit arrangement shown in FIG. 1 and in similar prior art circuits. Further, the PA 10 load line can be adaptively compensated in substantially real time, resulting in the PA 10 maintaining the required performance under varying load conditions. The use of this invention also minimizes the losses between the PA 10 and the antenna 24. Through the use of this invention the design of the transmitter, such as a WCDMA transmitter, is simplified, and the required printed circuit board area, the cost, and the required operating power are reduced. A reduction in operating power can result in increased talk times for a WCDMA mobile station or cellular telephone that includes the PA 10 in accordance with this invention.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims.

As but some examples, the use of other techniques for implementing the IDET 30 and VDET 32 functions may be used, different PA architectures may be used (e.g., one or three amplifier stages as opposed to the two shown), more or less than two Vref thresholds (e.g., +15 dBm and +20 dBm) may be used and/or the Vref threshold values may differ from those described, and a re-ordering of at least some of the comparisons shown in FIG. 6 may be attempted by those skilled in the art. Further, in some embodiments the output transistor Q1 may actually be implemented as a plurality of paralleled transistors, and in this case the values of IDET and VDET may be scaled as appropriate. Further still, this invention can be used with other than a WCDMA-based system and/or a wireless terminal. However, all such and similar modifications of the teachings of this invention will still fall within the scope of this invention.

Further, while the method and apparatus described herein are provided with a certain degree of specificity, the present invention could be implemented with either greater or lesser specificity, depending on the needs of the user. Further still, some of the features of the present invention could be used to advantage without the corresponding use of other features. As such, the foregoing description should be considered as merely illustrative of the principles of the present invention, and not in limitation thereof.

What is claimed is:

1. A power amplifier module operable over a range of output power levels, comprising an output transistor having an input coupled to an input node of the power amplifier module and an output coupled to an output node of the power amplifier module, the power amplifier module further comprising circuitry for automatically compensating a load line of the output transistor for impedance variations appearing at the output node, the circuitry comprising detection circuitry for generating a first detection signal having a value that is indicative of the current flowing through the output transistor and a second detection signal having a value that is indicative of the voltage appearing at the output of the output transistor, and further comprising compensation circuitry for controlling the generation of a plurality of power amplifier bias current and bias voltage signals to have values that are a function of the values of the first and second detection signals, and the current output power level of the power amplifier module.

2. A power amplifier module as in claim 1, further comprising an impedance matching circuit coupled between the output of the output transistor and the output node, the impedance matching circuit presenting a variable impedance that is controlled by an output signal from the compensation circuitry.

3. A power amplifier module as in claim 2, where the output signal from the compensation circuitry is generated to have a value that is a function of the value of the first detection signal and the current output power level.

4. A power amplifier module as in claim 2, where the output signal from the compensation circuitry is generated when the current output power level exceeds a predetermined output power level.

5. A power amplifier module as in claim 1, where the compensation circuitry makes a change to at least one of the plurality of power amplifier bias current and bias voltage signals when the current output power level exceeds a predetermined output power level.

6. A power amplifier module as in claim 2, where the compensation circuitry makes a change to at least one of the plurality of power amplifier bias current and bias voltage signals when the current output power level exceeds a first predetermined output power level, and where the output signal from the compensation circuitry to the impedance matching circuit is generated when the current output power level exceeds a second predetermined output power level that is greater than the first predetermined output power level.

7. A power amplifier module as in claim 1, where the compensation circuitry controls the generation of the power amplifier bias current signal as a function of a value of the first detection signal and a value of a signal that is indicative of the current output power level, and controls the generation of the power amplifier bias voltage signal as a function of a value of the second detection signal and the value of the signal that is indicative of the current output power level.

8. A power amplifier module as in claim 1, where the detection circuitry comprises a current mirror in parallel with the output transistor for generating the first detection signal, and a rectifier coupled to the output of the output transistor for generating the second detection signal.

9. A method to operate a power amplifier module over a range of output power levels, comprising:
generating a first detection signal having a value that is indicative of current flowing through an output transistor and a second detection signal having a value that is indicative of a voltage appearing at an output of the output transistor; and
automatically compensating a load line of the output transistor for impedance variations appearing at an output node of the power amplifier module by controlling the generation of a plurality of power amplifier bias current and bias voltage signals to have values that are a function of the values of the first and second detection signals, and the current output power level of the power amplifier module.

10. A method as in claim 9, further comprising controlling, with an output signal from the compensation circuitry, a value of an impedance matching circuit coupled between the output of the power transistor and the output node.

11. A method as in claim 10, further comprising generating the output signal from the compensation circuitry to have a value that is a function of the value of the first detection signal and the current output power level.

12. A method as in claim 10, further comprising comparing the current output power level to a predetermined output power level; and generating the output signal from the compensation circuitry only if the current output power level exceeds the predetermined output power level.

13. A method as in claim 9, further comprising comparing the current output power level to a predetermined output power level; and changing at least one of the plurality of power amplifier bias current and bias voltage signals if the current output power level exceeds the predetermined output power level.

14. A method as in claim 10, further comprising comparing the current output power level to a first predetermined output power level; changing at least one of the plurality of power amplifier bias current and bias voltage signals if the current output power level exceeds the first predetermined output power level; comparing the current output power level to a second predetermined output power level; and generating the output signal from the compensation circuitry if the current output power level exceeds the second predetermined output power level,
where the second predetermined output power level is greater than the first predetermined output power level.

15. A method as in claim 9, where generating the power amplifier bias current signal comprises comparing the first detection signal to a signal having a value that is indicative of the current output power level, and where generating the power amplifier bias voltage signal comprises comparing the second detection signal to the signal having the value that is indicative of the current output power level.

16. A method as in claim 10, where generating the first detection signal comprises mirroring the current flowing in the output transistor, and where generating the second detection signal comprises rectifying a signal appearing at the output of the output transistor.

17. A radio frequency (RF) power amplifier module operable over a range of output power levels, comprising an output transistor having an input coupled to an input node of the power amplifier module for receiving a wideband code division, multiple access signal to be transmitted from an antenna and an output coupled to an output node of the RF power amplifier module, the RF power amplifier module further comprising circuitry for automatically compensating the output transistor for impedance variations appearing at the output node due at least in part to a change in an RF propagation environment of the antenna, the circuitry comprising detection circuitry for generating a first detection signal having a value that is indicative of the current flowing through the output transistor and a second detection signal having a value that is indicative the voltage appearing at the output of the output transistor, and further comprising compensation circuitry for controlling the generation of a plurality of power amplifier bias current and bias voltage signals to have values that are a function of the values of the first and second detection signals, respectively, and the value of a signal that is indicative of a current output power level of the RF power amplifier module, further comprising an impedance matching circuit coupled between the output of the output transistor and the output node, the impedance matching circuit presenting a variable impedance that is controlled by an output signal from the compensation circuitry, where the output signal from the compensation circuitry is generated to have a value that is a function of the value of the first detection signal and the value of the signal that is indicative of the current output power level of the RF power amplifier module.

18. The RF power amplifier module as in claim 17, where the compensation circuitry makes a change to at least one of the plurality of power amplifier bias current and bias voltage signals if the current output power level exceeds a first predetermined output power level, and where the output signal from the compensation circuitry is generated only if the current output power level exceeds a second predetermined output power level that is greater than the first predetermined output power level.

19. The RF power amplifier module as in claim 17, where the detection circuitry comprises a current mirror in parallel with the output transistor for generating the first detection signal and a rectifier coupled to the output of the output transistor for generating the second detection signal.

20. A radio frequency (RF) power amplifier contained within a package, the RF power amplifier being operable over a range of output power levels specified by a value of a power control signal that is one of applied to a first input of the package and generated internally to the package, the RF power amplifier comprising at least one output transistor having an input coupled to second input of the package for receiving an input RF signal and an output coupled to an output of the package for outputting an amplified RF signal, the RF power amplifier further comprising circuitry integrated with the at least one output transistor for automatically compensating the RF amplifier for impedance variations appearing at the first output, the circuitry comprising detection circuitry for generating detection signals indicative of current flowing through the at least one output transistor and of a voltage appearing at the output of the at least one output transistor, and further comprising load line compensation circuitry responsive to the detection signals and to the power control signal for maintaining a desired output linearity of the amplified RF signal.

21. A mobile radiocommunication terminal comprising an antenna and, coupled to the antenna, a radio frequency (RF) power amplifier module that is operable over a range of output power levels, said RF power amplifier module comprising at least one output transistor having an input coupled to an input node of the power amplifier module for receiving a signal to be transmitted from the antenna and an output coupled to an output node of the RF power amplifier module, the RF power amplifier module further comprising circuitry for automatic compensation of the output transistor for impedance variations appearing at the output node due at least in part to variations in an environment of the antenna, the automatic compensation circuitry comprising detection circuitry for generating a first detection signal having a value that is indicative of the current flowing through the at least one output transistor and a second detection signal having a value that is indicative the voltage appearing at the output of the at least one output transistor, and further comprising bias control circuitry for controlling the generation of a plurality of power amplifier bias current and bias voltage signals to have values that are a function of the values of the first and second detection signals, respectively, and also the value of a signal that is indicative of a current output power level of the RF power amplifier module, further comprising an impedance matching circuit coupled between the output of the at least one output transistor and the output node, the impedance matching circuit presenting a variable impedance that is controlled by an output signal from the automatic compensation circuitry, where the output signal from the automatic compensation circuitry is generated to have a value that is a function of the value of the first detection signal and the value of the signal that is indicative of the current output power level of the RF power amplifier module.

22. The mobile radiocommunication terminal as in claim 21, where the automatic compensation circuitry makes a change to at least one of the plurality of power amplifier bias current and bias voltage signals if the current output power level exceeds a first predetermined output power level, and where the output signal to the impedance matching circuit is generated if the current output power level exceeds a second predetermined output power level that is greater than the first predetermined output power level.

23. The mobile radiocommunication terminal as in claim 21, where the detection circuitry comprises a current mirror in parallel with the at least one output transistor for generating the first detection signal.

24. The mobile radiocommunication terminal as in claim 21, where the detection circuitry comprises a rectifier coupled to the output of the at least one output transistor for generating the second detection signal.

25. The mobile radiocommunication terminal as in claim 21, where a signal transmitted from said antenna comprises a wideband code division, multiple access signal.

\* \* \* \* \*